US009812555B2

(12) United States Patent
Madurawe et al.

(10) Patent No.: US 9,812,555 B2
(45) Date of Patent: Nov. 7, 2017

(54) BOTTOM-GATE THIN-BODY TRANSISTORS FOR STACKED WAFER INTEGRATED CIRCUITS

(71) Applicant: SEMICONDUCTOR COMPONENTS INDUSTRIES, LLC, Phoenix, AZ (US)

(72) Inventors: Raminda Madurawe, Sunnyvale, CA (US); Hamid Soleimani, Cupertino, CA (US); Irfan Rahim, Milpitas, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 214 days.

(21) Appl. No.: 14/723,719

(22) Filed: May 28, 2015

(65) Prior Publication Data

US 2016/0353038 A1 Dec. 1, 2016

(51) Int. Cl.
*H01L 21/00* (2006.01)
*H01L 29/66* (2006.01)
(Continued)

(52) U.S. Cl.
CPC ........ *H01L 29/66742* (2013.01); *H01L 21/84* (2013.01); *H01L 23/481* (2013.01); *H01L 27/12* (2013.01); *H01L 27/1463* (2013.01); *H01L 27/1469* (2013.01); *H01L 27/14612* (2013.01); *H01L 27/14616* (2013.01); *H01L 27/14634* (2013.01); *H01L 27/14689* (2013.01); *H01L 29/0649* (2013.01); *H01L 29/41733* (2013.01); *H01L 29/42384* (2013.01); *H01L 29/78696* (2013.01); *H01L 27/1464* (2013.01); *H01L 2029/42388* (2013.01)

(58) Field of Classification Search
CPC .. H01L 29/66742; H01L 23/481; H01L 27/12
See application file for complete search history.

(56) References Cited

U.S. PATENT DOCUMENTS 5,573,964 A 11/1996 Hsu et al.
6,392,271 B1 5/2002 Alavi et al.
(Continued)

OTHER PUBLICATIONS

Saraswat et al., "3-Dimensional ICs: Motivation, Performance Analysis and Technologoy", Stanford University, Stanford, California, Litho Workshop, 2009, 38 pages.
(Continued)

*Primary Examiner* — Laura Menz
(74) *Attorney, Agent, or Firm* — Treyz Law Group, P.C.; Jason Tsai; Joseph F. Guihan (57) ABSTRACT

An integrated circuit die may include bottom-gate thin-body transistors. The bottom-gate thin-body transistors may be formed in a thinned-down substrate having a thickness that is defined by shallow trench isolation structures that provide complete well isolation for the transistors. The transistors may include gate terminal contacts formed through the shallow trench isolation structures, bulk terminal contacts that are formed through the thinned substrate and that overlap with the gate contacts, and source-drain terminal contacts with in-situ salicide. Additional metallization layers may be formed over the gate/bulk/source-drain contacts after bonding.

16 Claims, 9 Drawing Sheets

(51) Int. Cl.
*H01L 29/423* (2006.01)
*H01L 29/417* (2006.01)
*H01L 29/786* (2006.01)
*H01L 29/06* (2006.01)
*H01L 21/84* (2006.01)
*H01L 27/12* (2006.01)
*H01L 23/48* (2006.01)
*H01L 27/146* (2006.01)

(56) References Cited

U.S. PATENT DOCUMENTS

| | | | |
|---|---|---|---|
| 6,624,032 B2 | 9/2003 | Alavi et al. | |
| 7,518,189 B1 | 4/2009 | Hackler et al. | |
| 8,796,085 B2 | 8/2014 | Koldiaev et al. | |
| 9,318,375 B2 * | 4/2016 | La Tulipe, Jr. | H01L 21/76802 |
| 9,564,464 B2 * | 2/2017 | Madurawe | H01L 27/14634 |
| 9,613,994 B2 * | 4/2017 | Yamashita | H01L 27/14609 |
| 2005/0286287 A1 * | 12/2005 | Park | G11C 11/5621 |
| | | | 365/63 |
| 2009/0065941 A1 * | 3/2009 | La Tulipe, Jr. | H01L 21/76802 |
| | | | 257/761 |
| 2011/0102657 A1 * | 5/2011 | Takahashi | H01L 21/76898 |
| | | | 348/308 |
| 2012/0248544 A1 * | 10/2012 | Yokoyama | H01L 21/84 |
| | | | 257/369 |
| 2012/0261780 A1 * | 10/2012 | Lin | B32B 7/12 |
| | | | 257/432 |
| 2013/0020662 A1 * | 1/2013 | Kao | H01L 27/14632 |
| | | | 257/431 |
| 2014/0091414 A1 * | 4/2014 | Shimotsusa | H01L 21/76898 |
| | | | 257/431 |
| 2014/0103414 A1 | 4/2014 | Koldiaev et al. | |
| 2014/0264693 A1 * | 9/2014 | Oganesian | H01L 24/95 |
| | | | 257/432 |
| 2016/0353038 A1 * | 12/2016 | Madurawe | H01L 29/42384 |
| 2016/0358967 A1 * | 12/2016 | Madurawe | H01L 27/14634 |
| 2017/0053960 A1 * | 2/2017 | Wakiyama | H01L 23/3192 |
| 2017/0236745 A1 * | 8/2017 | Okamoto | H01L 21/76804 |

OTHER PUBLICATIONS

Coudrain et al., "Towards a Three-Dimensional Back-Illuminated Miniaturized CMOS Pixel Technology using 100nm Inter-Layer Contacts" 3CEA Leti-MINATEC, Grenoble, France, 4 pages.

* cited by examiner

BOTTOM-GATE THIN-BODY TRANSISTORS FOR STACKED WAFER INTEGRATED CIRCUITS

BACKGROUND

This relates generally to—transistors for integrated circuits, and particularly to transistors for stacked die configuration.

Modern electronic devices such as cellular telephones, cameras, and computers often include integrated circuits comprising transistors. Integrated circuits may be fabricated on single semiconductor wafers or a plurality of semiconductor wafers bonded to form a stacked semiconductor wafer. Single and stacked wafer integrated circuits include memory, processor, and digital image sensors. A stacked wafer and a stacked die integrated circuit include two silicon substrates stacked one above the other in a 3D configuration. One or more of the silicon substrates may include Silicon-On-Insulator (SOI) device structures. An image sensor includes a two-dimensional array of image sensing pixels. Each pixel typically includes a photosensitive element such as a photodiode that receives incident photons (light) and converts the photons into electrical signals. Configurations of a stacked imaging system in which a CMOS image sensor die is stacked on top of a digital signal processor (DSP) have been developed to help separate the formation of the analog image sensor circuitry such as photodiode structures and the formation of the digital pixel transistor circuitry into separate integrated circuit dies.

In one conventional stacked arrangement as described by Coudrain et al. (see, "Towards a Three-Dimensional Back-Illuminated Miniaturized CMOS Pixel Technology using 100 nm Inter-Layer Contacts," incorporated herein as a reference), a backside illuminated silicon wafer is monolithically bonded to Silicon on Insulator (SOI) pixel transistors. Photodiodes are first formed in the silicon wafer, which is then bonded and thinned down to construct the SOI pixel transistors above the photodiodes. Formed in this way, the area above the photodiodes is occupied by the SOI pixel transistor (which restricts metal line routing for 3D logic integration), and the thermal cycles that are used to form the SOI transistors can negatively affect the doping of the photodiode and degrade well capacity. Moreover, the photodiodes and the SOI pixel transistors are bound by the same CMOS processing limitations.

In another conventional stacked arrangement as described by Saraswat et al. (see, "3-Dimensional ICs: Motivation, Performance Analysis and Technology," incorporated herein as a reference), a fully processed pixel wafer is adhesively bonded to a fully processed analog/digital companion wafer. Forming a stacked image system in this way, however, is costly since both wafers require expensive transistor and metal processing steps, offers poor wafer-to-wafer interconnect density, and requires use of large and deep through-silicon via connections that affect color-filter-array (CFA) processing.

It is within this context that the embodiments described herein arise.

DETAILED DESCRIPTION

Embodiments of the present invention relate to fabrication of transistors for integrated circuits. Transistors include multi-terminal devices operable in an on-state and an off-state, and can transition between the on and off states. A four terminal transistor may include a gate terminal, a source terminal, a drain terminal, and a bulk terminal. The gate terminal modulates the current between source and drain terminals, while the bulk terminal stabilizes the device operation. Integrated circuits typically include a collection of transistors, capacitors, diodes, and other electrical components. These integrated circuits may include micro-processors, memories, and image sensors. In this disclosure, bottom-gate thin-body transistors are described in relation to CMOS image sensors. An image sensor generally includes analog circuits, digital circuits, memory elements, photodiodes, resistors, and capacitors. It will be recognized by one skilled in the art, that the present exemplary embodiments may be practiced without some or all of these specific details. In other instances, well-known operations have not been described in detail in order not to unnecessarily obscure the present embodiments.

All electronic devices use transistors. Different types of transistors include Bipolar junction field-effect transistors and metal-oxide-semiconductor field-effect transistors (as examples). MOSFETs fall into bulk, silicon-on-insulator (SOI), and FinFET. Bulk MOSFETs comprise a thick substrate; SOI comprises a thin substrate on an insulator; and FinFETs comprise a gate wrapped around a substrate fin. The substrate is a pristine single-crystalline semiconductor material that provides the desired level of device quality. In all cases, an insulator material is deposited over the pristine substrate, and the gate material is deposited over the insulator material. Various dopants are introduced into the substrate to obtain desired device properties. The transistor construction sequence is important to maintain the pristine quality of substrate.

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands of pixels or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
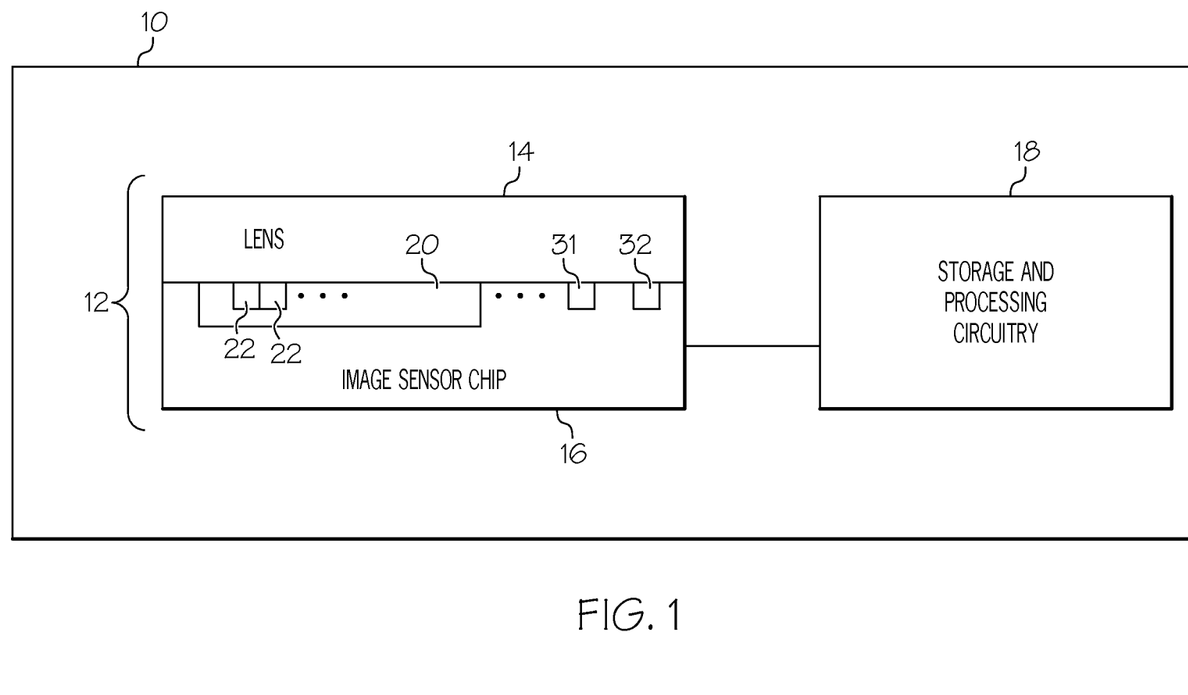
FIG. 1 is a diagram of an illustrative imaging system that may include a camera module having an image sensor in accordance with an embodiment.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20 or on a separate companion die/chip.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 16. Image sensor 16 may, for example, be a frontside illumination (FSI) image sensor or a backside illumination (BSI) image sensor. If desired, camera module 12 may be provided with an array of lenses 14 and an array of corresponding image sensors 16. Lens structures 14 may include at least one macrolens (sometimes referred to as a camera lens) for directing incoming light to a corresponding array of smaller microlenses each of which is formed over a respective image sensor pixel (see, e.g., pixels 22).

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices.

As we approach the limits of photolithography to pattern ever smaller gate lengths with each successive technology node, chip stacking techniques such as 3D bonding and 3D packaging have been introduced in an effort to keep up with Moore's law. Problems associated with current state-of-the-art stacking solutions are describes in the Background section. In an effort to provide low cost, high performance, and low power 3D stacking for imaging systems, a bottom-gate thin-body dual-oxide dual-voltage transistor configuration is provided herein.

All integrated circuits undergo parallel limitations as described above for image sensors. Doubling useable gate capacity by shrinking geometries is diminishing with the high fabrication costs associated with double-patterning. Stacking solutions are prevalent to improve useable gate density within a given footprint. That does not necessarily mean the cost is reduced. In most cases the objective is to reduce the form-factor of a hand-held device and not the cost. Among stacked solutions, die-to-die, wafer-to-die and wafer-to-wafer stacking are common solutions for IC gate density improvement. In an effort to provide low cost, high performance, and low power 3D stacking for IC's, a bottom-gate thin-body dual-oxide dual-voltage transistor configuration is provided herein.

Figure 2:
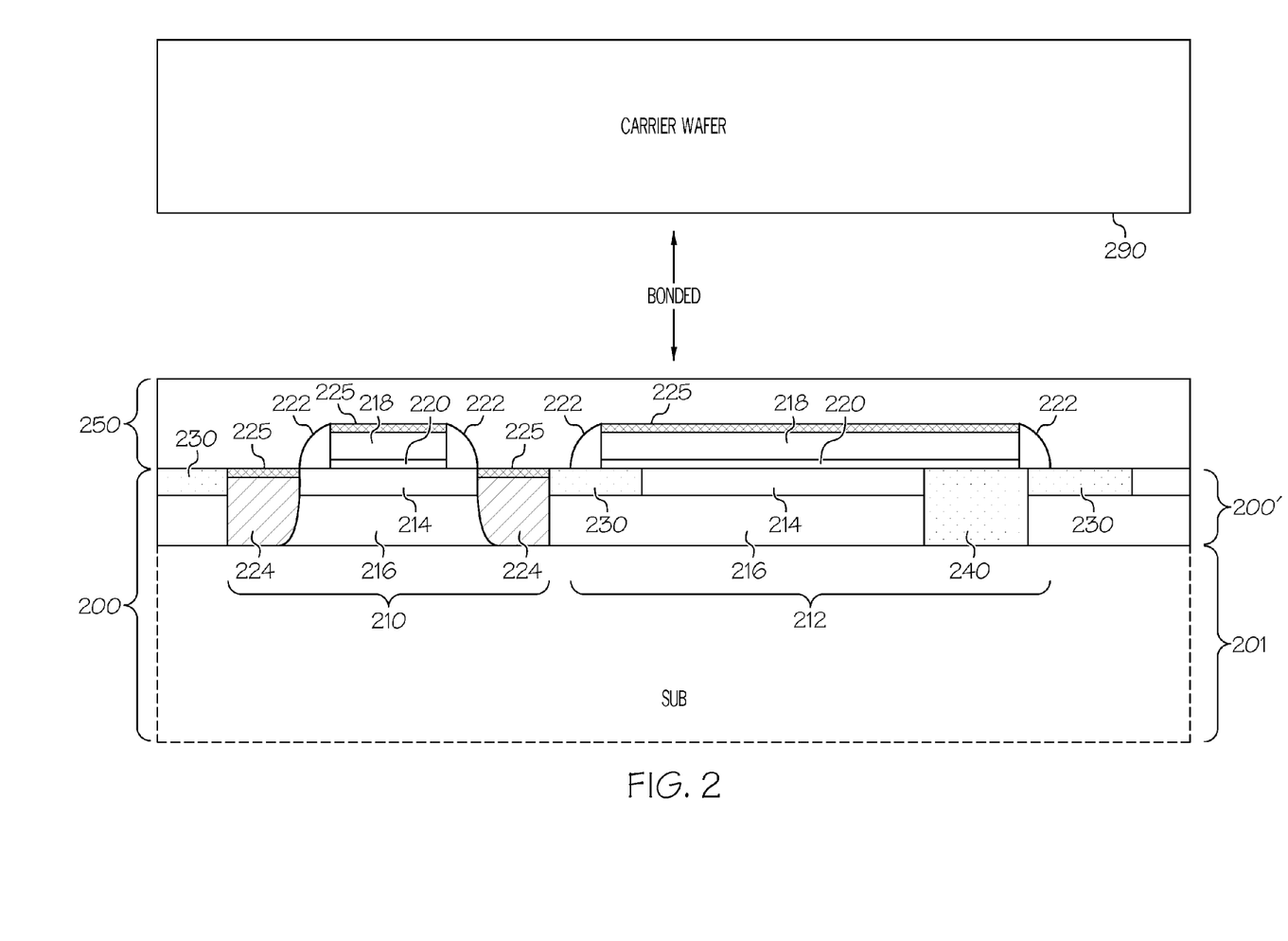
FIG. 2 is a cross-sectional side view of illustrative bottom-gate transistors prior to having their substrate thinned down in accordance with an embodiment.

FIG. 2 is a cross-sectional side view of illustrative bottom-gate transistors prior to having their substrate thinned down in accordance with an embodiment. As shown in FIG. 2, transistors 210 and 212 may be formed in a semiconductor substrate such as p-type substrate 200. Substrate 200 may be a single crystalline substrate and may exhibit pristine silicon properties required for high mobility, low defects, and low noise. In particular, FIG. 2 shows transistor 210 that is cut along a direction that is perpendicular to its width to expose its source-drain regions 224 and channel region 214, whereas transistor 212 is cut along a direction that is parallel to its width. A layer of salicide 225 may be formed on the source-drain regions 224 to help reduce the source-drain resistance and to help improve current flow through the associated channel regions. Source-drain regions 224 may be n+ diffusion regions (for n-channel transistors) or p+ diffusion regions (for p-channel transistors).

Each of transistors 210 and 212 may include a gate conductor 218 (e.g., a polysilicon gate structure or a metal gate structure) formed over channel region 214. A layer of salicide 225 may be formed on the gate regions 218 to help reduce the polysilicon gate resistance and to help improve current flow to charge the gate capacitance. Salicide 225 can also be formed on associated source-drain regions to help reduce source and drain resistances. A gate insulating layer 220 (e.g., a gate oxide layer) may be formed between gate conductor 218 and the surface of substrate 200. In accordance with some embodiments, transistors may be provided with two or more different gate oxide thicknesses to help support operation at two or more voltage levels. For example, 1.2V transistors may have a gate oxide thickness of 15 to 30 angstroms, whereas 2.5V transistors may have a gate oxide thickness of 50 to 80 angstroms. Gate oxides may include DPN techniques to prevent Boron penetration, improve breakdown voltage and reduce gate leakage. Spacer structures 222 (e.g., oxide, nitride or composite gate spacers) may laterally surround the gate conductors 218. Lightly-doped drain (LDD) and/or halo implants may be performed after gate formation to further control the behavior of the channel region 214. A dielectric layer 250 (e.g., an oxide layer) may be formed on the gate structures over substrate 200.

At least two different types of shallow trench isolation (STI) structures may be formed in substrate 200. Shallow trench isolation structures 230 may extend from the surface of substrate 200 to a first depth that is as deep as the channel regions 214, whereas shallow trench isolation structures 240 may extend from the surface of substrate 200 to a second depth that is greater than the first depth. Formed in this way, the shallower STI (SSTI) structures 230 may be used to provide isolation between adjacent transistors. The deeper STI (DSTI) structures 240 may be at least as deep as the source-drain regions 224.

The transistor bulk regions 216 (sometimes referred to as "body" regions) may have a doping level that defines the source-drain diffusion region isolation requirements of each transistor to prevent undesired punch-through and to provide low bulk conductivity when the body is subsequently thinned down. Bulk regions 216 may generally exhibit a different dopant concentration than the channel regions 214. The bulk doping levels may be used to adjust break-down voltages, if desired. This can be achieved by adding a lighter doped source/drain implant adjacent to the heavy source/drain 224 implants touching bulk region 216. Channel regions 214 for transistors supporting different operating voltages may be doped differently to tune the threshold and punch-through voltages.

After formation of the dielectric planarization layer 250, all high temperature processing steps may be complete. High temperature steps ensure dopant activation, damage annealing (due to implants), quality oxide growth, and other fabrication nuances needed for high transistor performance and quality. The wafer may then be bonded upside-down to a carrier wafer such as carrier wafer 290 (e.g., a substrate wafer or another device wafer that includes one or more metal structures). The carrier wafer may include an oxide layer at the bonding surface to facilitate an oxide-to-oxide bonding. It may be noted that the bonding scheme may be a different bonding scheme known in the art, such as metal-to-metal or composite oxide/metal interface bonding. After being bonded to carrier wafer 290, substrate 200 may be thinned down (e.g., by removing dotted substrate portion 201 and leaving intact portion 200'). The thickness of the thinned-down portion 200' may be defined by the thickness of the deep STI (DSTI) structures 240. Thickness of the thinned-down substrate 200' may generally range from 500 to 5000 angstroms (as an example). If desired, STI structures 240 may also be formed from the back side after the substrate has been thinned down.

Figure 3:
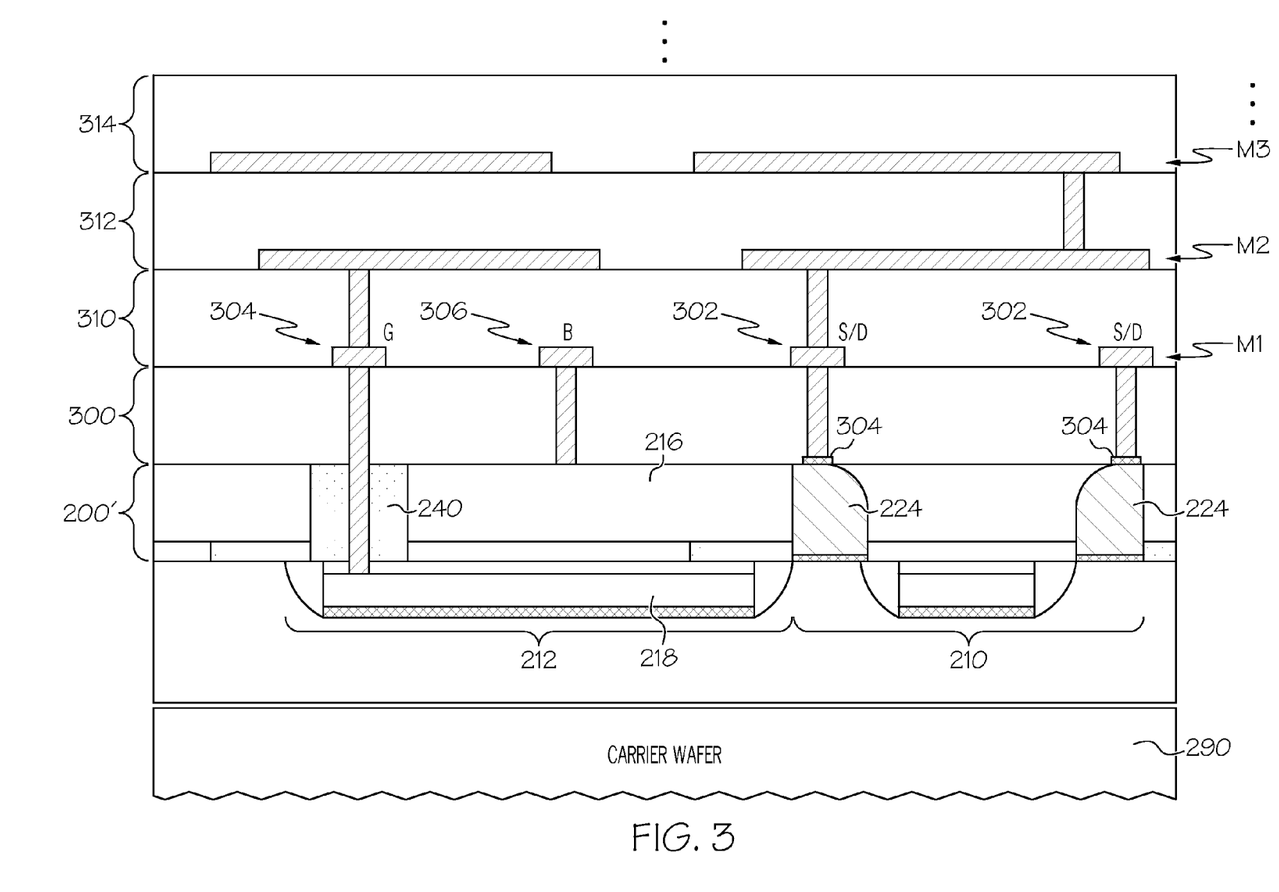
FIG. 3 is a cross-sectional side view of illustrative bottom-gate transistors having terminal contacts formed through a thin body in accordance with an embodiment.

After being bonded to another wafer and after having its body thinned down, additional metal routing layers may be formed on the back side of substrate 200' (see, e.g., FIG. 3). The surface of substrate 200' may be treated to remove any thinning related defects. As shown in FIG. 3, a first interlayer dielectric (ILD) layer 300 may be formed directly on substrate 200'. A contact layer may be used to define transistor gate, source, drain, and bulk regions that need to be connected. The contact layer can be directly aligned to any one of the thinned-down silicon geometries through transparent layers. There is no wafer-to-wafer alignment involved, and hence very high gate densities can be realized with metal contacts. Transistor gate terminal contacts such as gate contact 304 may be formed through the deep STI (DSTI) structures 240 (e.g., all bottom-gate contacts may be formed through DSTI structures 240). Transistor bulk terminal contacts such as body contact 306 may only extend through ILD layer 300 to make contact with bulk region 216 and may be positioned directly on top of the bottom-gate conductor 218 to maximize device density.

The source-drain terminal contacts such as source-drain contacts 302 may also only extend through ILD layer 300 to make contact with the corresponding source-drain diffusion regions 224. If desired, the source-drain contacts 302, gate contact 304, and bulk contact 306 may be in-situ salicided (i.e., the salicide is formed during deposition of—a multilayer contact metal). For example, nickel, titanium, titanium nitride, or other suitable silicide material may first be deposited within an etched contact hole prior to the contact metal deposition to serve as a layer of "glue" for the contact metal. A low-temperature rapid thermal anneal (RTA) or laser anneal may be used to salicide the bottom metal touching silicon. Then a filling metal such as tungsten may be deposited to complete the contact fill process and then polished (e.g., using chemical mechanical planarization techniques) to create contact plugs. Alternatively, after the metal contact has been deposited and polished, a low temperature annealing process may be performed to trigger formation of the contact salicide at the silicon-silicide interface. In-situ salicide reduce contact resistance to silicon.

Thereafter, additional ILD layers 310, 312, and 314 may be formed over the transistor terminal contacts. The transistor terminal contacts and any associated routing path that are formed directly on ILD layer 300 in layer 310 may sometimes be referred to as a first metal (M1) metal routing layer. Metal routing structures formed in layer 312 may be referred to as a second metal (M2) metal routing layer. Similarly, metal routing structures formed in layer 314 may be referred to as a third metal (M3) metal routing layer. Alternating metal routing layers and interposing via layers formed in this way may sometimes be referred to collectively as a dielectric stack or an interconnect stack. In general, the dielectric stack may include any number of metal routing layers (e.g., the interconnect stack may include less than three metal layers, four or more metal layers, eight or more metal layers, etc.). Because gate 218 is formed below the gate and source/drain terminals and because the substrate 200' is thinned down, transistors 210 and 212 may therefore sometimes be referred to as "bottom-gate thin-body" transistors.

Figure 4A:
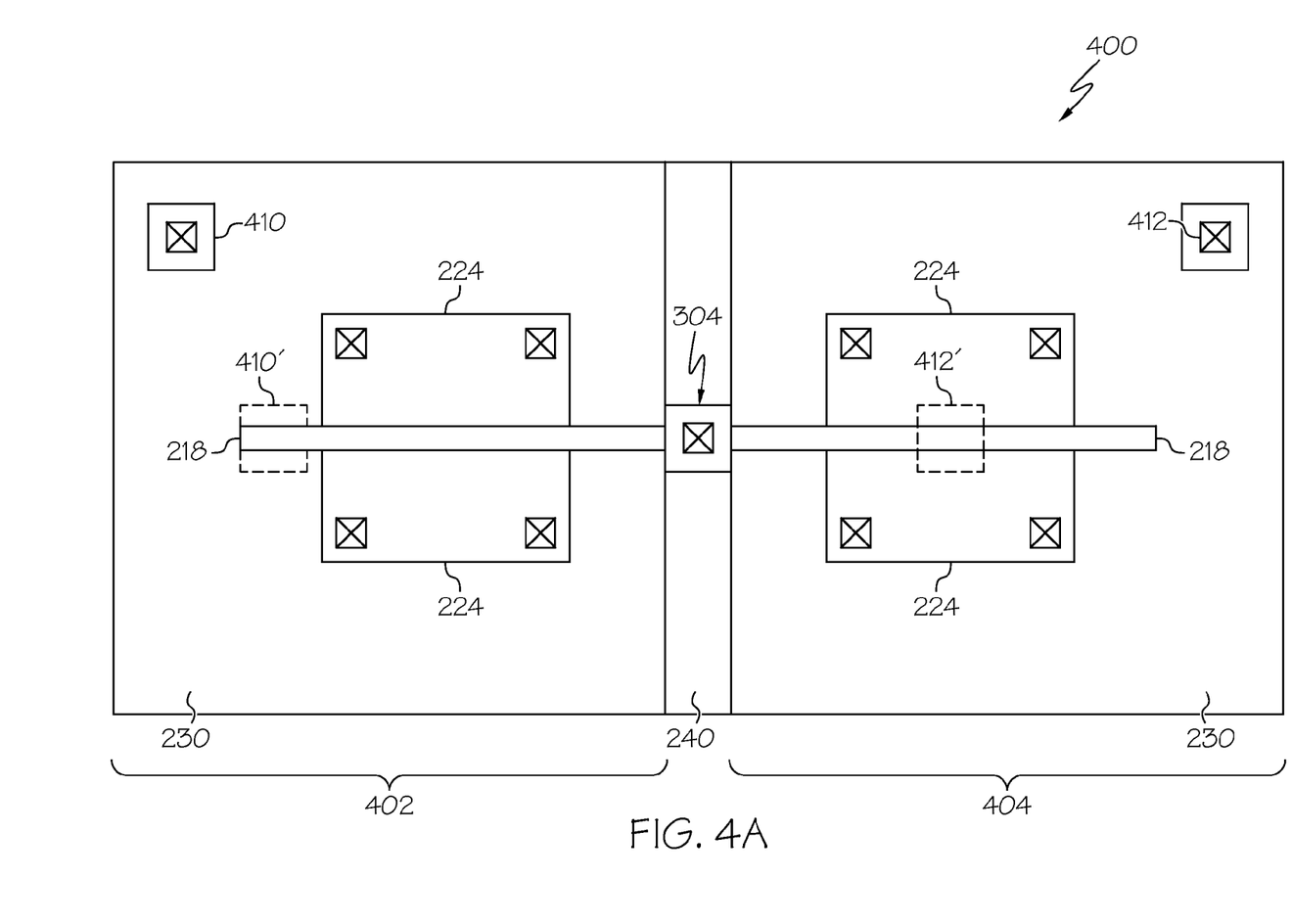
FIG. 4A is a top view of an illustrative inverter formed using bottom-gate thin-body transistors of the type shown in FIG. 3 in accordance with an embodiment.

FIG. 4A is a top view of an illustrative inverter 400 formed using bottom-gate thin-body transistors of the type shown in FIG. 3 in accordance with an embodiment. As shown in FIG. 4A, inverter 400 may include an n-channel transistor 402 and a p-channel transistor 404 that are coupled in series and that share a common gate terminal 218. The bulk region of n-channel transistor 402 and the bulk region of p-channel transistor 404 may be separated by the deep STI (DSTI) region 240 to provide full body isolation. As described above, gate contact 304 may be formed through DSTI region 240 (see, center of inverter 400). With DSTI 240 between NMOS 402 and PMOS 404, there is no latch-up path (lateral bipolar current path) between the n-well bulk region for transistor 404 and the p-well bulk region for transistor 402. This allows very tight spacing between the NMOS and PMOS transistors to improve CMOS gate density.

Still referring to FIG. 4A, a first p-well tap 410 may be formed in transistor 402 in any region not covered by DDTI 240. For example, tap 410 may overlap with the shallow STI (SSTI) structure 230 to make contact with the body region of n-channel transistor 402. Since the contact is made from the opposite direction of SSTI (see, e.g., contact 306 in FIG. 3 where the contact touches region 216), it can be placed directly under SSTI 230 to reduce layout area and improve gate density. A second n-well tap 412 may also be formed underneath SSTI structure 230 to make contact with the body region of p-channel transistor 404. Body contacts that are placed at the periphery of the transistors are merely illustrative. As described above in connection with FIG. 3, the body contacts may be placed to overlap directly with the gate conductors (e.g., as illustrated by positions 410' and 412') to further reduce the minimum required cell area for inverter 400.

Figure 4B:
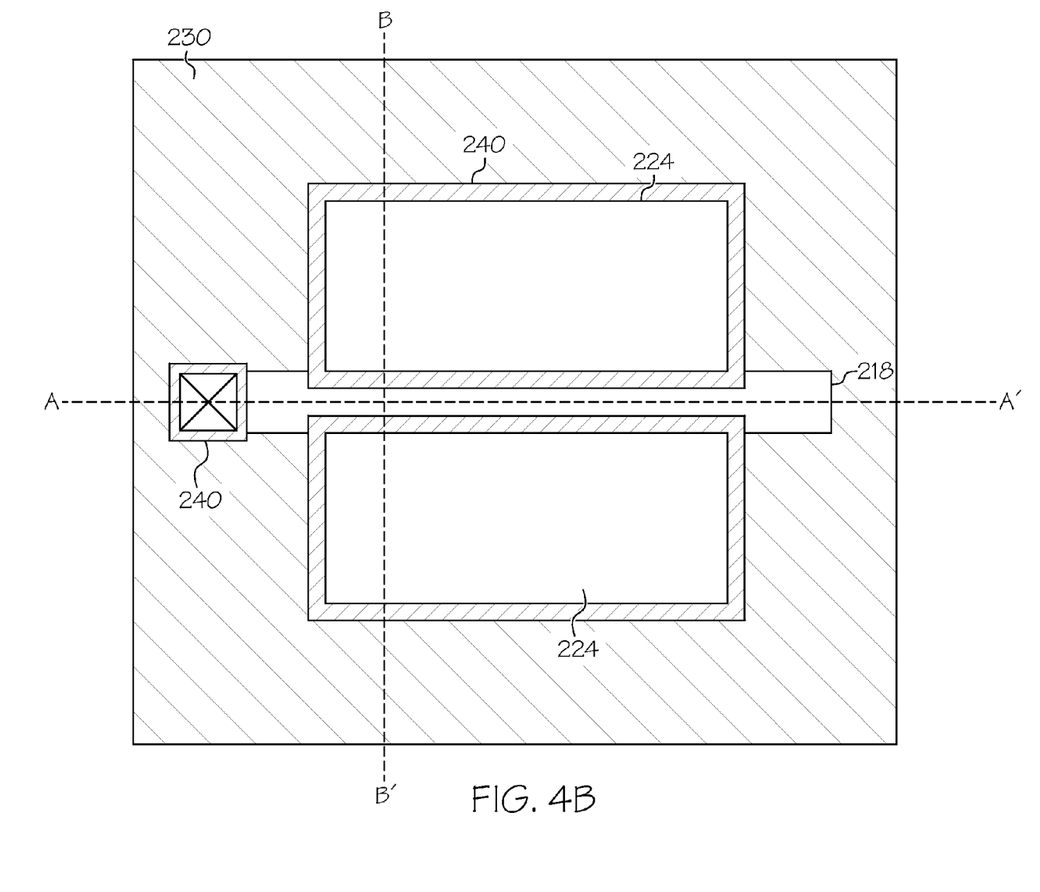
FIG. 4B is a top view of a bottom-gate thin-body transistor in accordance with an embodiment.
Figure 4C:
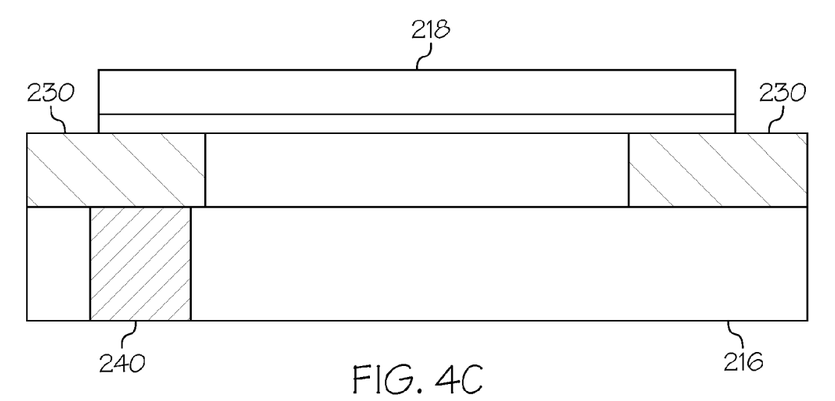
FIG. 4C is a cross-sectional side view of the transistor of FIG. 4B cut along the gate structure in accordance with an embodiment.
Figure 4D:
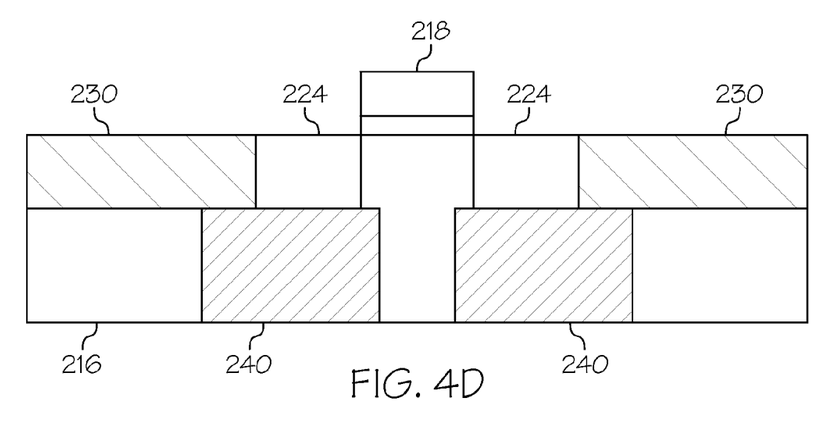
FIG. 4D is a cross-sectional side view of the transistor of FIG. 4C cut across the gate structure in accordance with an embodiment.

Advantages of performing deeper shallow trench isolation (DSTI) from the back side are illustrated in FIG. 4B. FIG. 4B is a top-view of a transistor layout. For illustrative purposes, only the NMOS transistor 402 of FIG. 4A is shown. FIG. 4B shows a cross-sectional side view cut through the gate conductor along axis AA', whereas FIG. 4C shows a cross-sectional side view cut perpendicular to the gate conductor along axis BB'. SSTI regions 230 surround the body of transistor 402 and are formed from the front side before the substrate is thinned down. DSTI regions 240 in FIG. 4D may be formed after bonding and after substrate 216 is thinned down from back-side. The depth of DSTI allows DSTI to touch SSTI, thereby forming complete isolation for the thin-body regions 214 and 216. One familiar in the art will recognize that contacts to source-drain regions 224 in FIG. 4D are made through the DSTI regions 240 contacting silicon at the depth defined by SSTI 230. In FIG. 4C, the region where DSTI 240 overlaps SSTI 230 is used to form the bottom-gate contact to gate conductor 218. A single source or drain region 224 has one edge under the gate conductor 218, and three sides surrounded by SSTI 230 regions. Furthermore, region 224 has DSTI oxide completely under the source or drain region. Since this region has only a single diffusion edge to the threshold-adjust diffusion region 214 under the gate conductor 218, it has ultra-low junction capacitance, ultra-low junction leakage, and very high junction break down voltage. Thus a back-side DSTI thin-body bottom-gate transistor can be used for high voltage, high temperature (due to low leakage), high performance (due to high switching speed), and low power (due to low leakage & low switching power) operations.

Figure 5:
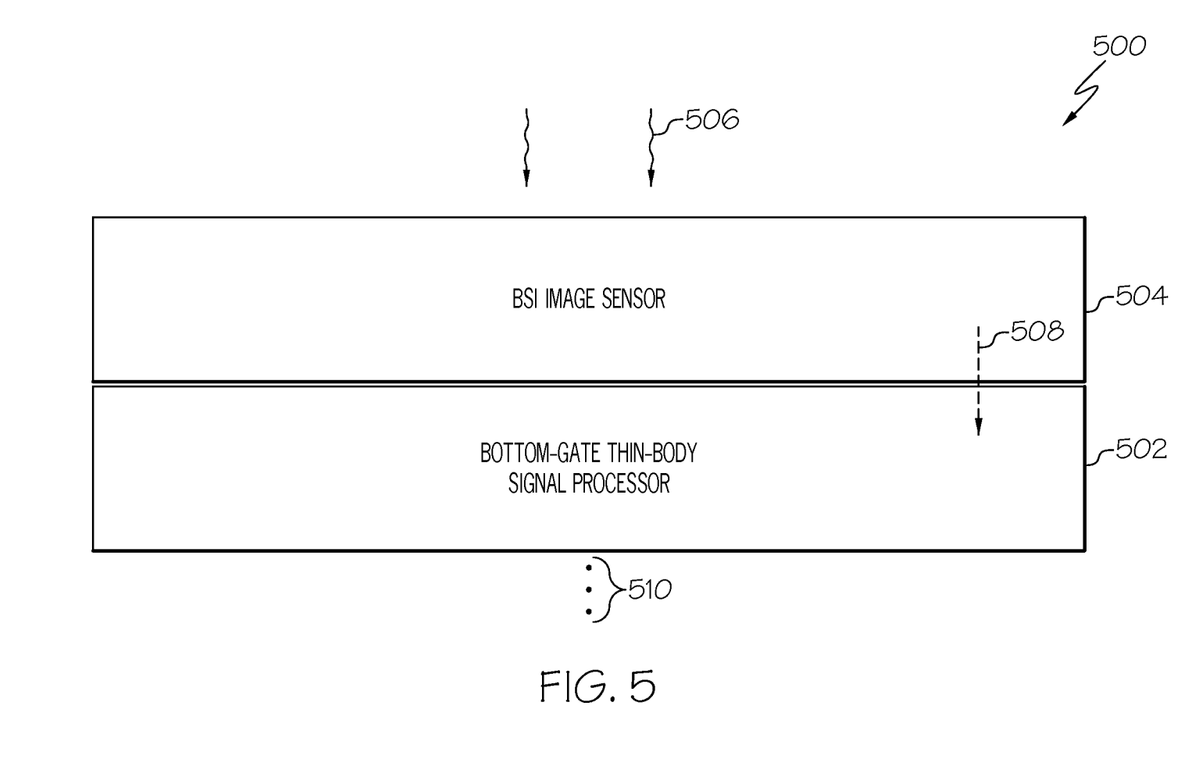
FIG. 5 is a diagram of an illustrative image system having stacked dies in accordance with an embodiment.

As alluded to earlier in the description of FIGS. 2 and 3, the use of bottom-gate thin-body devices may be particularly suitable for stacked integrated circuits, including imaging systems. FIG. 5 shows an exemplary imaging system 500 that includes a backside illuminated (BSI) image sensor 504 that is stacked on top of a bottom-gate thin-body signal processor 502. BSI image sensor 504 may, for example, include photodiodes that receive incoming light 506 and that output corresponding analog signals to processor 502 for conversion and digital processing (as indicated by arrow 508). The ability for the bottom-gate thin-body wafer 502 to be stacked on top of another wafer (e.g., wafer 504 in the example of FIG. 5) and to continue additional metallization processing steps may be referred to herein as "monolithic stacking," which reduces the need for multiple wafers to have their own separate set of routing layers while allowing the different wafers to be initially constructed using different processing technologies. If desired, system 500 may also include other stacked wafers/dies, as indicated by 510.

Figure 6:
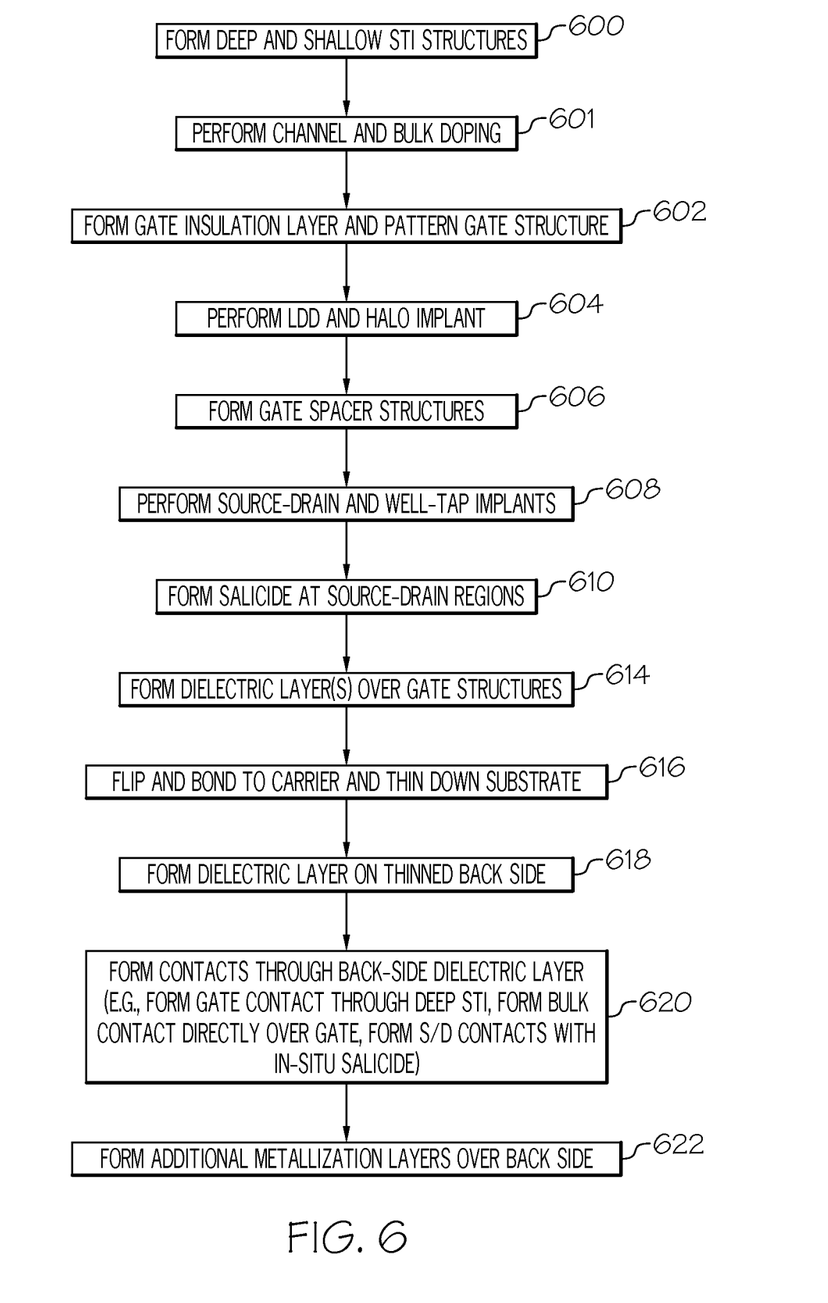
FIG. 6 is a flow chart of illustrative steps for manufacturing imaging circuitry having bottom-gate thin-body transistor structures in accordance with an embodiment.

FIG. 6 is a flow chart of illustrative steps for manufacturing digital and analog circuitry having bottom-gate thin-body transistor structures in accordance with an embodiment. At step 600, a pristine substrate wafer may be used to perform deep (DSTI) and shallow (SSTI) trench isolation regions. The DSTI thickness defines the thin-down depth of the substrate for the bottom-gate transistor later in manufacturing process, while the SSTI depth defines the transistor threshold adjust depth. At step 601, dopants may be implanted into the substrate to form channel regions 214 and bulk regions 216 at the same time (e.g., using a shallow implant to form the channel regions and a deep implant to form the bulk regions). For example, channel and bulk regions for n-channel transistors may be doped during a first time period, whereas channel and bulk regions for p-channel transistors may be doped during a second time period after the first time period, using different masking steps. In this fashion, any number of transistor families may be formed, each family having a threshold optimized doping level within a depth of SSTI in the transistor.

At step 602, gate insulating layer 220 and transistor gate structures 218 may be formed and patterned. If desired, two or more gate oxides of different thicknesses may be formed during this step. For example, oxide can first be grown on two separate regions, and during a subsequent step, oxide from only one of the two regions is etched back to change the thicknesses between the two separate regions. Thereafter, additional oxide can be grown on both regions to complete the dual gate oxide deposition. Nitrogen may be incorporated into as grown oxides by plasma nitridation methods, such as for example decoupled plasma nitridation (DPN), to modulate dielectric properties.

At step 604, the lightly-doped drain (LDD) and halo implant may be selectively performed to help further control and tune the electrical characteristic of the channel region that lies beneath the gate structures. If desired, different transistors may be doped differently to help vary the threshold voltages. As an example, transistors with thicker gate oxides may be operable with higher voltage levels and may therefore be doped to exhibit a higher threshold voltage. LDD doping levels may also be adjusted to match transistor operating voltages. Alternatively, transistors with thinner gate oxides may be operable with lower voltage levels and may therefore be doped to exhibit a lower threshold voltage. At step 606, gate spacer structures 222 may be formed to laterally surround the gate structures 218.

At step 608, dopants may be implanted into the substrate to form transistor source-drain regions 224 and well tap regions (e.g., regions 410 and 412 in FIG. 4). Feathered implants may be used to increase lateral junction break down voltage for high-voltage operation. At step 610, salicide 225 may be formed at the front surface of the substrate directly on the gate, bulk and source-drain regions 224 to help reduce the source-drain resistance and improve contact resistance to silicon.

Instead of forming DSTI/SSTI at step 600, shallow trench isolation (STI) structures with different depths may alternatively be formed after step 610 and before step 614. For example, a shallow STI structure 230 may be formed in the substrate that provides partial transistor isolation, whereas a deep STI structure 240 may be formed in the substrate that provides complete bulk isolation. If desired, STI structures with yet other suitable depths may also be formed. It is possible to form three or four different STI depths in this scheme, wherein the deepest STI depth is used to control the thickness of thin-body in subsequent steps. At step 614, one or more dielectric layers 250 may be formed over the gate structures 218.

At step 616, the structures formed thus far may be flipped over and bonded to a carrier wafer (e.g., another semiconductor substrate or integrated circuit die). After bonding, the substrate of the transistor wafer may then be thinned down to the depth as defined by the deep STI structures 240. If desired, the substrate may be thinned down to some predetermined thickness, and the deep STI structures 240 may instead be formed from the back side of the substrate after thinning. Back-side STI may overlap front-side STI to form complete thinned bulk silicon isolation. Back-side STI may not overlap front-side STI to form body isolated junctions that require very high break down voltages.

At step 618, an ILD layer (e.g., dielectric layer 300) may be formed on the thinned back side of the substrate. At step 620, transistor terminal contacts may be formed through ILD layer 300. In one embodiment, the gate terminal contacts may be formed through the deep STI structures 240. In another embodiment, the body terminal contacts may be formed directly above the shallow STI structure 230. In yet another embodiment, the body terminal contacts may be formed directly above the bottom gate conductors. In yet another embodiment, the gate, body, and source-drain terminal contacts may be formed with in-situ salicide (e.g., silicide material may be deposited while filling the metal contact holes and then subsequently annealed).

At step 622, additional metallization layers may be formed over the transistor terminal contacts to complete the interconnect stack. In general, the interconnect stack may include any number of metal routing layers and interposing via layers. The steps of FIG. 6 are merely illustrative and do not serve to limit the scope of the present invention. If desired, the order of these steps may be changed and additional processing steps can be inserted without departing from the spirit of the invention.

Bottom-gate thin-body transistors formed in this way may exhibit lower junction capacitance (which yields improved performance without incurring excessive power consumption), complete vertical isolation (which prevents latch-up between n-well and p-well boundaries and helps to improved gate density), and improved bulk control since the body contact may be placed closer to channel in the substrate. The source and bulk terminals may also be shorted together to help the source follower transistor in a pixel to be less susceptible to body bias effects (to help improve transistor linearity). Bottom-gate transistors may have very high junction break-down by using back-side STI to surround junctions. Bottom-gate transistors may have low source, drain and gate resistance due to salicidation. Bottom-gate transistors may have low contact resistance to silicon due to in-situ salicidation during contact metal-fill process. Bottom-gate transistors may be suitable for very high temperature, very high voltage, very high performance, and very low power applications.

Figure 7:
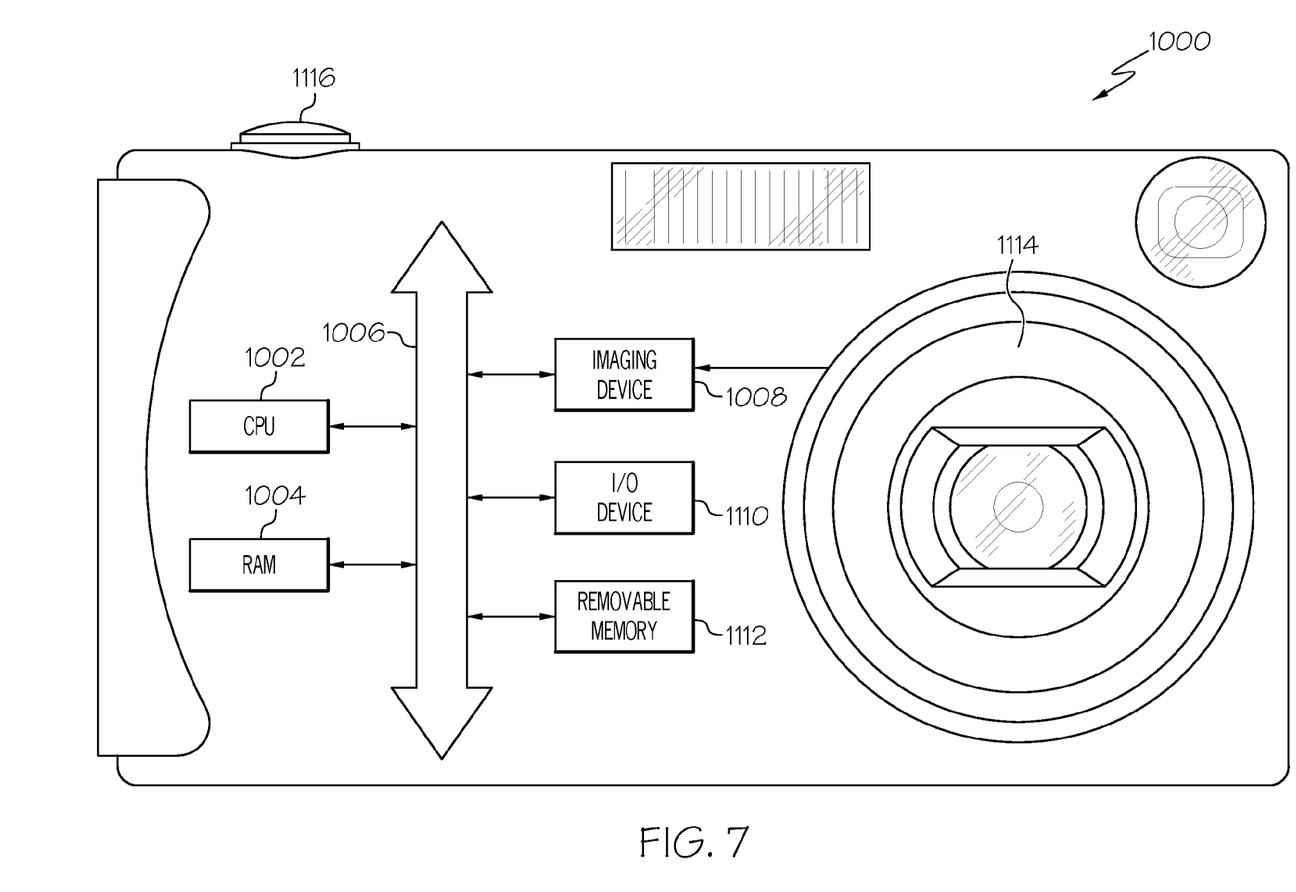
FIG. 7 is a block diagram of a system employing at least some of the embodiments of FIGS. 3-6 in accordance with an embodiment of the present invention.

FIG. 7 is a simplified diagram of an illustrative processor system 1000, such as a digital camera, which includes an imaging device 1008 (e.g., the camera module of FIG. 1) employing an imager having bottom-gate thin-body transistor structures. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel array in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating an electronic device (see, e.g., device 10 of FIG. 1) that includes an imaging system and host subsystems. An imaging system may include one or more image sensors. Each image sensor may include an array of image pixels formed on a semiconductor substrate. Each image pixel may include one or more photosensitive elements configured to convert incoming light into electric charges.

In accordance with an embodiment, an image pixel may include a bottom-gate thin-body transistor that includes a substrate having a first surface and a second surface, a gate conductor formed over the first surface of the substrate, and a gate terminal contact that is formed over the second surface of the substrate. A dielectric layer may be interposed between the substrate and the gate terminal contact. A first type of shallow trench isolation structure may be formed in the substrate, where the gate terminal contact is coupled to the gate conductor through the first type of shallow trench isolation structure, and where the first type of shallow trench isolation structure defines the thickness of the substrate. A second type of shallow trench isolation structure may also be formed in the substrate and may have a different depth than the first type of shallow trench isolation structure.

The transistor may also include a body terminal contact that is formed over the second surface of the substrate, where the body terminal contact has a length that is substantially equal to the thickness of the dielectric layer. In certain arrangements, the body terminal contact may overlap directly with the shallower STI or the gate conductor to help improve pixel density. The transistor may also include source-drain diffusion regions formed in the substrate and source-drain terminal contacts that are formed over the second surface of the substrate and that are in-situ salicided at the second surface of the substrate. Salicide may also be formed on the source-drain diffusion regions at the first surface of the substrate to help reduce source-drain resistance. A plurality of metallization layers may be formed above the gate terminal contact over the second surface of the substrate.

In accordance with another embodiment, a method of fabricating bottom-gate thin-body transistor structures on a substrate having first and second surfaces is provided. The method includes forming a gate conductor on the first surface of the substrate, thinning the substrate from its second surface, and forming a gate terminal contact from the second surface of the substrate after thinning the substrate. A dielectric layer may be formed on the gate conductor over the first surface of the substrate. The dielectric layer may be bonded to a separate carrier wafer prior to thinning the substrate.

A shallow trench isolation structure may be formed in the substrate. The shallow trench isolation structure may have a depth that defines the thickness of the thin substrate. A contact hole may for connecting the gate conductor to the gate terminal contact may be formed through the shallow trench isolation structure. The transistor structure may have channel and bulk regions that are simultaneously doped and source-drain regions that are in-situ salicided. The bottom-gate thin-body transistor structures may include transistors with at least two different gate dielectric thicknesses for handling different operating voltage levels.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. A transistor in an integrated circuit, comprising:
a substrate having a first surface and a second surface;
a gate conductor formed over the first surface of the substrate;
a dielectric layer formed over the second surface of the substrate; and
a gate terminal contact that is formed over the dielectric layer, wherein the gate terminal contact passes through the dielectric layer and the substrate to directly contact the gate conductor.

2. The transistor defined in claim 1, further comprising:
a shallow trench isolation structure formed in the substrate, wherein the gate terminal contact passes through the shallow trench isolation structure to directly contact the gate conductor, and wherein the shallow trench isolation structure defines the thickness of the substrate.

3. A transistor in an integrated circuit, comprising:
a substrate having a first surface and a second surface;
a gate conductor formed over the first surface of the substrate;
a gate terminal contact that is formed over the second surface of the substrate;
a shallow trench isolation structure formed in the substrate, wherein the gate terminal contact is coupled to the gate conductor through the shallow trench isolation structure, and wherein the shallow trench isolation structure defines the thickness of the substrate; and
an additional shallow trench isolation structure that is formed in the substrate and that has a different depth than the shallow trench isolation structure.

4. The transistor defined in claim 3, further comprising:
a body terminal contact that is formed over the second surface of the substrate and directly over the additional shallow trench isolation structure, wherein the body terminal contact has a length that is substantially equal to the thickness of the dielectric layer.

5. The transistor defined in claim 4, wherein the body terminal contact overlaps directly with the gate conductor.

6. The transistor defined in claim 1, further comprising:
source-drain diffusion regions that are formed in the substrate and extend between the first and second surfaces; and
source-drain terminal contacts that are formed over the second surface of the substrate and that are in-situ salicided at the second surface of the substrate.

7. The transistor defined in claim 6, further comprising:
salicide formed on the source-drain diffusion regions at the first surface of the substrate.

8. The transistor defined in claim 1, further comprising:
a plurality of metallization layers formed above the gate terminal contact over the second surface of the substrate.

9. The transistor defined in claim 2, further comprising:
an additional shallow trench isolation structure that is formed in the substrate and that has a different depth than the shallow trench isolation structure.

10. The transistor defined in claim 9, further comprising:
a body terminal contact that is formed over the second surface of the substrate, wherein the substrate includes a bulk region, and wherein the body terminal contact passes through the dielectric layer to directly contact the bulk region.

11. The transistor defined in claim 1, further comprising:
a body terminal contact that is formed over the second surface of the substrate, wherein the body terminal contact passes through the dielectric layer to directly contact a bulk region of the transistor.

12. A transistor in an integrated circuit, comprising:
a substrate having a first surface and a second surface, wherein a portion of the substrate forms a bulk region for the transistor;
a gate conductor formed over the first surface of the substrate;
a dielectric layer formed over the second surface of the substrate;
a gate terminal contact that is formed over the second surface of the substrate, wherein the gate terminal contact passes through the dielectric layer and the substrate to directly contact the gate conductor; and
a body terminal contact that is formed over the second surface of the substrate, wherein the body terminal contact passes through the dielectric layer to directly contact the bulk region.

13. The transistor defined in claim 12, further comprising:
a shallow trench isolation structure formed in the substrate, wherein the gate terminal contact passes through the shallow trench isolation structure to directly contact the gate conductor.

14. The transistor defined in claim 13, wherein the shallow trench isolation structure defines the thickness of the substrate.

15. The transistor defined in claim 14, further comprising:
an additional shallow trench isolation structure that is formed in the substrate and that has a smaller depth than the shallow trench isolation structure.

16. The transistor defined in claim 12, further comprising:
source-drain diffusion regions that are formed in the substrate and extend between the first and second surfaces; and
source-drain terminal contacts that are formed over the second surface of the substrate, wherein the source-drain terminal contacts pass through the dielectric layer to directly contact the source-drain diffusion regions.

* * * * *